US009024199B2

(12) United States Patent
Lee et al.

(10) Patent No.: US 9,024,199 B2
(45) Date of Patent: May 5, 2015

(54) MULTILAYER CERAMIC ELECTRONIC COMPONENT AND BOARD FOR MOUNTING THE SAME

(71) Applicant: Samsung Electro-Mechanics Co., Ltd., Suwon, Gyunggi-do (KR)

(72) Inventors: Seung Ho Lee, Gyunggi-do (KR); Dae Bok Oh, Gyunggi-do (KR); Jong Han Kim, Gyunggi-do (KR); Su Hwan Cho, Gyunggi-do (KR); Min Gon Lee, Gyunggi-do (KR); Wi Heon Kim, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 104 days.

(21) Appl. No.: 13/950,963

(22) Filed: Jul. 25, 2013

(65) Prior Publication Data

US 2014/0326493 A1 Nov. 6, 2014

(30) Foreign Application Priority Data

May 6, 2013 (KR) ........................ 10-2013-0050754

(51) Int. Cl.

| | |
|---|---|
| ***H05K 1/00*** | (2006.01) |
| ***H01G 4/01*** | (2006.01) |
| ***H01G 4/30*** | (2006.01) |
| ***H05K 1/18*** | (2006.01) |
| ***H05K 1/03*** | (2006.01) |

(52) U.S. Cl.

CPC . *H01G 4/01* (2013.01); *H01G 4/30* (2013.01); *H05K 1/181* (2013.01); *H05K 1/0306* (2013.01)

(58) Field of Classification Search

CPC .................................................... H05K 1/0306

See application file for complete search history.

(56) References Cited

U.S. PATENT DOCUMENTS

2005/0088803 A1 4/2005 Umeda et al.

FOREIGN PATENT DOCUMENTS

JP 2005-129802 A 5/2005

*Primary Examiner* — Jeremy C Norris

(74) *Attorney, Agent, or Firm* — McDermott Will & Emery LLP

(57) ABSTRACT

A multilayer ceramic electronic component includes: a ceramic body including a recess portion formed in a length direction of at least one main surface thereof so as to be inwardly concave and satisfying T (thickness)/W (width) >1.0; first and second internal electrodes disposed to face each other in the ceramic body; and first and second external electrodes extended from the end surfaces of the ceramic body to the at least one main surface, wherein when the ceramic body is divided into an upper region At, corresponding to 70% to 90% of an overall thickness of the ceramic body, and a lower region Ab, corresponding to 10% to 30% of the overall thickness of the ceramic body, a ratio of an average particle size of Ab materials to an average particle size of At materials is less than 0.5.

12 Claims, 5 Drawing Sheets

MULTILAYER CERAMIC ELECTRONIC COMPONENT AND BOARD FOR MOUNTING THE SAME

CROSS-REFERENCE TO RELATED APPLICATIONS

This application claims the priority of Korean Patent Application No. 10-2013-0050754 filed on May 6, 2013, in the Korean Intellectual Property Office, the disclosure of which is incorporated herein by reference.

BACKGROUND OF THE INVENTION

1. Field of the Invention

The present invention relates to a multilayer ceramic electronic component and a board for mounting the same.

2. Description of the Related Art

In general, in accordance with the recent trend for miniaturization of electronic products, a multilayer ceramic electronic component used in electronic products has been required to be reduced in size and to have a high level of capacitance implemented therein.

Therefore, efforts to thin dielectric layers and internal electrodes to be stacked in greater amounts have been attempted using various methods, and recently, a multilayer ceramic electronic component in which a thickness of the dielectric layer is reduced and the number of stacked dielectric layers is increased has been manufactured.

Accordingly, the multilayer ceramic electronic component is able to be miniaturized, due to the dielectric layers and the internal electrodes being thinned, allowing the number of stacked layers to be increased for the implementation of a high level of capacitance.

However, in the case in which the number of stacked layers is increased while the thicknesses of the dielectric layers and the internal electrodes are reduced as described above, the multilayer ceramic electronic component may achieve high capacitance, but a thickness of the resultant multilayer ceramic electronic component may be greater than a width thereof, due to an increase in the number of stacked layers.

In the case in which the thickness of the multilayer ceramic electronic component is greater than the width thereof as described above, since external electrodes formed on both end surfaces of the multilayer ceramic electronic component generally have a rounded circumferential surface.

Therefore, when the multilayer ceramic electronic component is mounted on a printed circuit board, or the like, the multilayer ceramic electronic component may not be maintained in amounted state, but may topple over frequently, whereby a failure rate in mounting the multilayer ceramic electronic component has increased.

Patent Document 1 discloses a multilayer ceramic capacitor reduced in size and having a high level of capacitance implemented therein. However, Patent Document 1 does not disclose solutions to the problem that the multilayer ceramic capacitor may topple over when the multilayer ceramic capacitor is mounted on a printed circuit board.

RELATED ART DOCUMENT (Patent Document 1) Japanese Patent Laid-open Publication No. 2005-129802

SUMMARY OF THE INVENTION

An aspect of the present invention provides a multilayer ceramic electronic component capable of decreasing a mounting failure and occurrence of a short-circuit by solving a problem that the multilayer ceramic electronic component having a thickness greater than a width thereof due to an increase in the number of stacked layers topples over at the time of being mounted on a printed circuit board, or the like, while having high capacitance implemented therein.

According to an aspect of the present invention, there is provided a multilayer ceramic electronic component including: a ceramic body including a plurality of dielectric layers and a recess portion formed in a length direction of at least one main surface thereof so as to be inwardly concave and satisfying $T/W>1.0$ when a width thereof is defined as W and a thickness thereof is defined as T; a plurality of first and second internal electrodes disposed in the ceramic body so as to face each other, having the dielectric layer interposed therebetween, and alternately exposed through both end surfaces of the ceramic body; and first and second external electrodes extended from the end surfaces of the ceramic body to the at least one main surface in which the recess portion is formed, and electrically connected to the first and second internal electrodes, respectively, wherein when the ceramic body is divided into an upper region At, corresponding to 70% to 90% of an overall thickness of the ceramic body, and a lower region Ab, corresponding to 10% to 30% of the overall thickness of the ceramic body, a ratio of an average particle size of Ab materials to an average particle size of At materials is less than 0.5.

The first and second internal electrodes may have a thickness of 0.2 μm to 0.85 μm.

The first and second internal electrodes disposed in the lower region of the ceramic body may have a thickness greater than that of the first and second internal electrodes disposed in the upper region of the ceramic body.

The ceramic body may satisfy $1.2<T/W<3.0$.

When a thickness of an edge portion of an end surface of the ceramic body is defined as Te and a thickness of a central portion of the end surface of the ceramic body is defined as Tc, $0.910\leq Tc/Te<0.995$ may be satisfied.

The upper region of the ceramic body may have electrode connectivity of 80% or more.

The lower region of the ceramic body may have electrode connectivity of 90% or more.

A difference in electrode connectivity between the lower region and the upper region of the ceramic body may be 5% or more.

The ceramic body may have the dielectric layers stacked in a thickness direction.

The ceramic body may have the dielectric layers stacked in a width direction.

The recess portion may be provided in both main surfaces of the ceramic body in an opposing manner.

According to another aspect of the present invention, there is provided a board for mounting a multilayer ceramic electronic component, the board including: a printed circuit board having first and second electrode pads provided thereon; and the multilayer ceramic electronic component as described above disposed on the first and second electrode pads.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
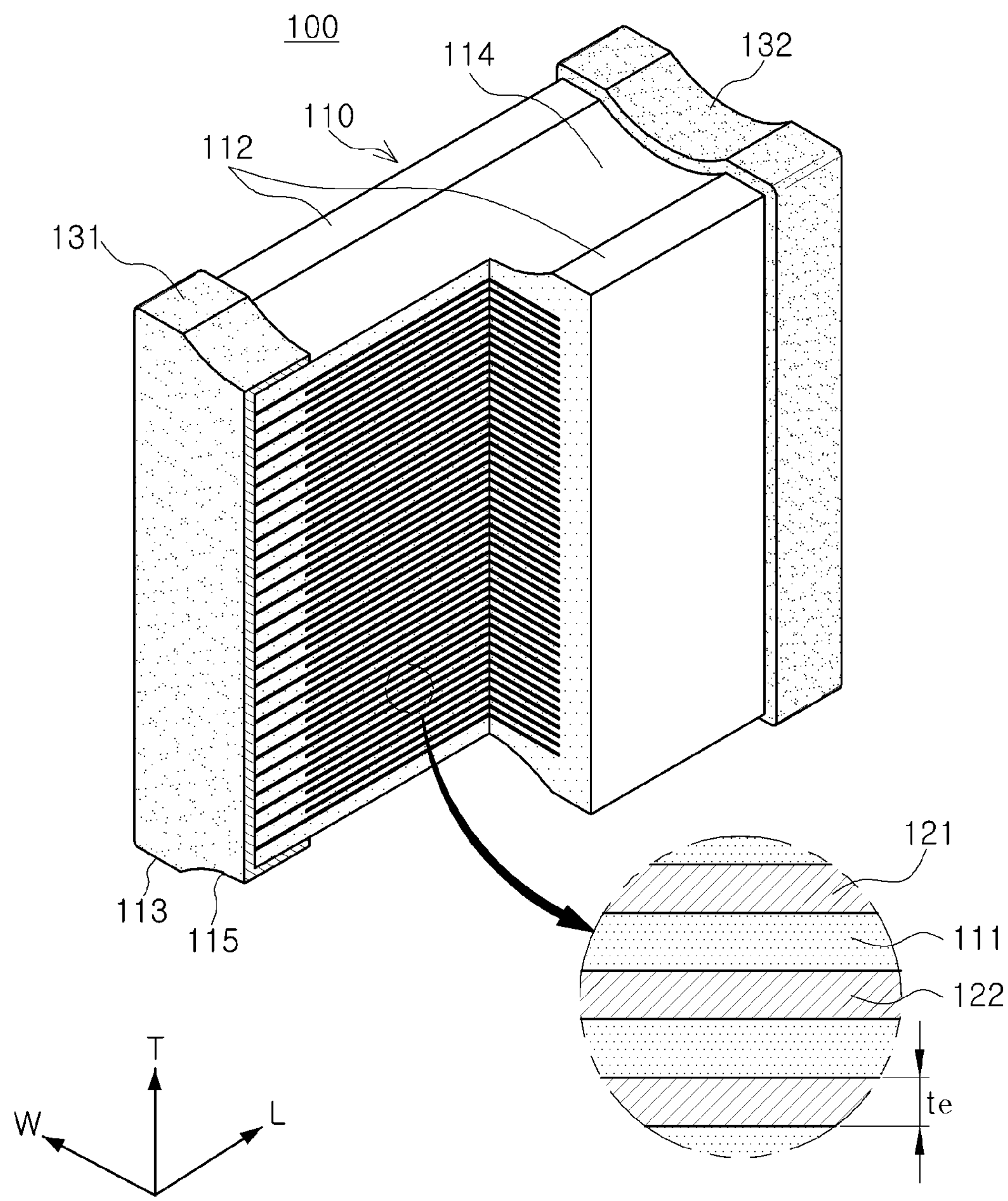
FIG. 1 is a partially cutaway perspective view of a multilayer ceramic capacitor according to an embodiment of the present invention.

Hereinafter, embodiments of the present invention will be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

Hereinafter, a multilayer ceramic electronic component according to an embodiment of the present invention will be described. Particularly, a multilayer ceramic capacitor will be described. However, the invention is not limited thereto.

Multilayer Ceramic Capacitor

Figure 2:
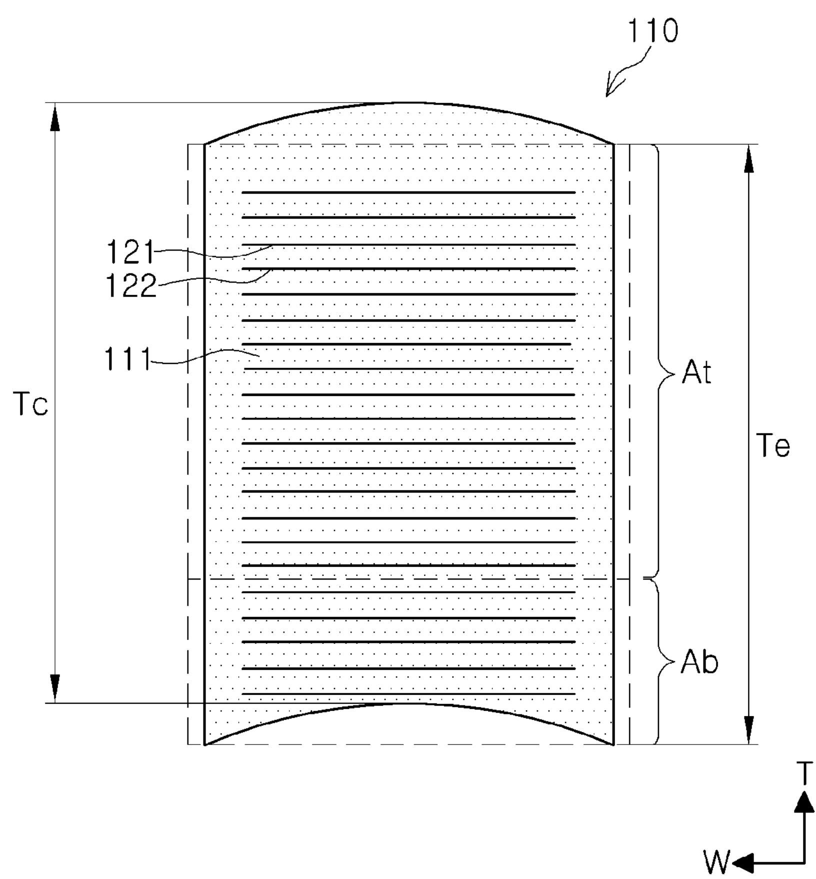
FIG. 2 is a cross-sectional view of the multilayer ceramic capacitor in a thickness-width direction according to the embodiment of the present invention.

FIG. 1 is a partially cutaway perspective view of a multilayer ceramic capacitor according to an embodiment of the present invention. FIG. 2 is a cross-sectional view of the multilayer ceramic capacitor in a thickness-width direction according to the embodiment of the present invention.

Referring to FIGS. 1 and 2, a multilayer ceramic capacitor 100 according to an embodiment of the present invention includes a ceramic body 110, a plurality of first and second internal electrodes 121 and 122, and first and second external electrodes 131 and 132.

The ceramic body 110 is formed by stacking a plurality of dielectric layers 111 in a thickness direction, and sintering the stacked dielectric layers. Here, adjacent dielectric layers 111 may be integrated such that boundaries therebetween may not be readily apparent without the use of a scanning electron microscope (SEM). A shape of the ceramic body 110 is not particularly limited, and for example, the ceramic body 110 may have a hexahedral shape.

When defining directions of the hexahedron forming the ceramic body 110 in order to clearly describe the embodiment of the invention, L, W and T shown in the drawings are a length direction, a width direction and a thickness direction, respectively.

In addition, for convenience of explanation, uppermost and lowermost surfaces of the ceramic body 110 opposing each other in a thickness direction refer to first and second main surfaces, end surfaces connecting the first and second main surfaces to each other and opposing each other in a length direction refer to first and second end surfaces, and side surfaces opposing each other in a width direction refer to first and second side surfaces.

The ceramic body 110 having a form in which the number of dielectric layers 111 is increased in order to implement a high degree of capacitance therein may satisfy $T/W>1.0$ when a width thereof is defined as Wand a thickness thereof is defined as T, such that the ceramic body 110 has a thickness greater than a width thereof. Here, the ceramic body 110 may satisfy $1.2<T/W<3.0$.

The number of stacked dielectric layers 111 is not specifically limited. For example, 500 or more dielectric layers may be stacked in order to realize high capacitance while securing a sufficient space when being mounted on a board.

Furthermore, the ceramic body 110 includes a recess portion 115 formed in a length direction of the second main surface so as to be inwardly concave when the second main surface is used as a mounting surface. Support portions 113 having a predetermined area are provided on both sides of the second main surface of the ceramic body 110 based on the recess portion 115. The support portions 113 may serve as support legs for preventing the multilayer ceramic capacitor 100 from toppling over unexpectedly when the multilayer ceramic capacitor 100 is mounted on a printed circuit board.

Furthermore, the first main surface of the ceramic body 110 opposing the second main surface may include a recess portion 114 formed in the length direction so as to be inwardly concave, such that the recess portion 114 opposes the recess portion 115 formed in the second main surface, if necessary.

The first and second main surfaces of the ceramic body 110 are provided to have a symmetric structure, which is prepared for a case in which the multilayer ceramic capacitor 100 is mounted inversely on a printed circuit board. In this case, the first main surface of the ceramic body 110 includes support portions 112 on both sides of the first main surface based on the recess portion 114, the support portions 112 corresponding to the support portions 113.

The dielectric layer 111 may include a ceramic material having a high degree of permittivity, for example, a $BaTiO_3$-based ceramic powder, or the like. However, the material of the dielectric layer is not limited thereto as far as sufficient capacitance may be obtained.

Furthermore, in addition to the ceramic powder, a transition metal oxide or carbide, a rare-earth element, various ceramic additives such as magnesium (Mg), aluminum (Al), and the like, an organic solvent, a plasticizer, a binder, a dispersant, or the like, may be added to the dielectric layer 111, if needed.

Herein, when the ceramic body 110 is divided into an upper region At, corresponding to 70 to 90% of an overall thickness of the ceramic body 110 and a lower region Ab, corresponding to 10 to 30% of the overall thickness of the ceramic body 110, a ratio of an average particle size of Ab materials to an average particle size of At materials is less than 0.5. In other words, as an average particle size of materials in the lower region Ab is reduced, a high degree of electrode connectivity may be realized. Also, such an effect may be increased when an average particle size of materials in the upper region At is two or more times greater than an average particle size of materials in the lower region At.

When a thickness of an edge portion of the end surface of the ceramic body 110 is defined as Te and a thickness of a central portion of the end surface of the ceramic body 110 is defined as Tc, $0.910 \leq Tc/Te<0.995$ may be satisfied. Tc/Te varies, depending on a depth of the recess portion 115. When Tc/Te is less than 0.910, cracks may occur in the ceramic body 110. When Tc/Te is more than 0.995, the mounting of the ceramic body 110 may be problematic.

Then, the upper region At of ceramic body 110 may have electrode connectivity of 80% or more, and the lower region Ab of ceramic body 110 may have electrode connectivity of 90% or more. A difference in electrode connectivity between the lower region and the upper region of the ceramic body may be 5% or more. That is, when the materials in the lower region Ab have a further reduced particle size, relative to the materials in the upper region At, electrode connectivity may be improved.

The first and second internal electrodes 121 and 122, having different polarities, may be disposed to face each other, having the ceramic sheet forming the dielectric layer 111 interposed therebetween, and may be exposed through the first and second end surfaces of the ceramic body 110, respectively.

Then, the first and second internal electrodes 121 and 122 may be insulated electrically from each other by the dielectric layer 111 interposed therebetween.

Further, the first and second internal electrodes 121 and 122 are formed of a conductive metal. For example, any one of silver (Ag), palladium (Pd), platinum (Pt), nickel (Ni) and copper (Cu) or alloys thereof, or the like, may be used as the conductive metal. However, the invention is not limited thereto.

Furthermore, the average thickness of the first and second internal electrodes 121 and 122 is not specifically limited, as long as the first and second internal electrodes may form capacitance. For example, the average thickness may be in a range of 0.2 μm to 0.85 μm. However, the invention is not limited thereto.

However, when the average thickness of the first and second internal electrodes 121 and 122 is greater than 0.85 μm and excessively increased, cracks may occur in the ceramic body 110.

The average thickness of the first and second internal electrodes 121 and 122 may be determined by scanning a cross-section of the ceramic body 110 in a width direction with Scanning Electron Microscope (SEM).

For example, the average thickness of the internal electrode may be calculated by measuring thicknesses at thirty equidistant points in the width direction of any one of the internal electrodes extracted from an image obtained by scanning the cross-section of the ceramic body 110 in the width and thickness (W-T) direction cut in a central portion of the ceramic body 110 in the length direction with the SEM.

The thicknesses at thirty equidistant points may be measured in an active region, a region in which the first and second internal electrodes 121 and 122 are overlapped with each other.

Furthermore, when the average thickness measurement is performed with respect to 10 or more internal electrodes, it can be more generalized.

In addition, the first and second internal electrodes 121 and 122 disposed in the lower region Ab of the ceramic body 110 may have a thickness greater than that of the first and second internal electrodes 121 and 122 disposed in the upper region At of the ceramic body 110.

The first and second external electrodes 131 and 132 may be extended from both end surfaces of the ceramic body 110 to the first and second main surfaces thereof in which the upper and lower recess portions 114 and 115 are formed. Also, the first and second external electrodes 131 and 132 may be electrically connected to the plurality of first and second internal electrodes 121 and 122, by covering portions of the plurality of first and second internal electrodes 121 and 122 exposed through the end surfaces of the ceramic body 110, respectively.

Further, the first and second external electrodes 131 and 132 are formed of a conductive metal, for example, silver (Ag), nickel (Ni), copper (Cu), or the like. The first and second external electrodes 131 and 132 may be formed by applying a conductive paste to both end surfaces of the ceramic body 110, the conductive paste being prepared by adding a glass frit to the conductive metal powder, and performing a sintering process thereon, but the invention is not limited thereto.

Meanwhile, first and second plating layers (not shown) may be formed on the first and second external electrodes 131 and 132, if necessary.

When the multilayer ceramic capacitor 100 is mounted on a printed circuit board with a solder, the first and second plating layers may increase adhesive strength therebetween.

For example, the first and second plating layers may include a nickel (Ni) plating layer formed on the first and second external electrodes 131 and 132, and a tin (Sn) plating layer formed on the nickel plating layer, but the invention is not limited thereto.

Table 1 shows whether or not the multilayer ceramic capacitor topples over at the time of being mounted on a printed circuit board, and whether or not capacitance and reliability of the multilayer ceramic capacitor are secured, in accordance with the thickness of the lower region of the ceramic body and a ratio of the thickness Tc of the central portion of the end surface of the ceramic body 110 to the thickness Te of the edge portion of the end surface of the ceramic body 110.

TABLE 1

| Sample No. | Thickness Ratio of Lower Region (%) | Tc/Te | Success in Mounting | Implementation of Target Capacitance | Reliability |
|---|---|---|---|---|---|
| 1 | 0 | 1.012 | X | X | ○ |
| 2 | 5 | 0.995 | X | ○ | ○ |
| 3 | 10 | 0.987 | ○ | ○ | ○ |
| 4 | 15 | 0.966 | ○ | ○ | ○ |
| 5 | 20 | 0.941 | ○ | ○ | ○ |
| 6 | 25 | 0.929 | ○ | ○ | ○ |
| 7 | 30 | 0.910 | ○ | ○ | ○ |
| 8 | 35 | 0.882 | ○ | ○ | X(cracks occurred) |
| 9 | 40 | 0.875 | ○ | ○ | X(cracks occurred) |
| 10 | 45 | 0.858 | ○ | X | X(cracks occurred) |
| 11 | 50 | 0.831 | ○ | X | X(cracks occurred) |

Referring to Table 1, in the case of Samples 1 and 2 in which the mounting surface, that is, the second main surface, of the ceramic body was downwardly convex or flat, it could be confirmed that when each sample was mounted on the printed circuit board twenty times, it toppled over several times. Particularly, Sample 1 failed to satisfy a target capacitance reference value.

In the case of Samples 3 to 7 in which the mounting surface, that is, the second main surface, of the ceramic body included a recess portion formed in a length direction so as to be inwardly concave, it could be confirmed that when each sample was mounted on the printed circuit board twenty times, it did not topple over. Further, target capacitance was achieved and no cracks in terms of reliability occurred.

In the case of Samples 8 to 12 in which the mounting surface, that is, the second main surface, of the ceramic body included a recess portion formed in a length direction so as to be inwardly concave, it could be confirmed that when each sample was mounted on the printed circuit board twenty times, it did not topple over. However, the recess portion was excessively concave, and thus, a failure in implementation of target capacitance occurred, and a margin portion of the ceramic body in a thickness direction was excessively thin, causing deterioration of moisture resistance and a reduction in reliability.

Modified Example

Figure 3:
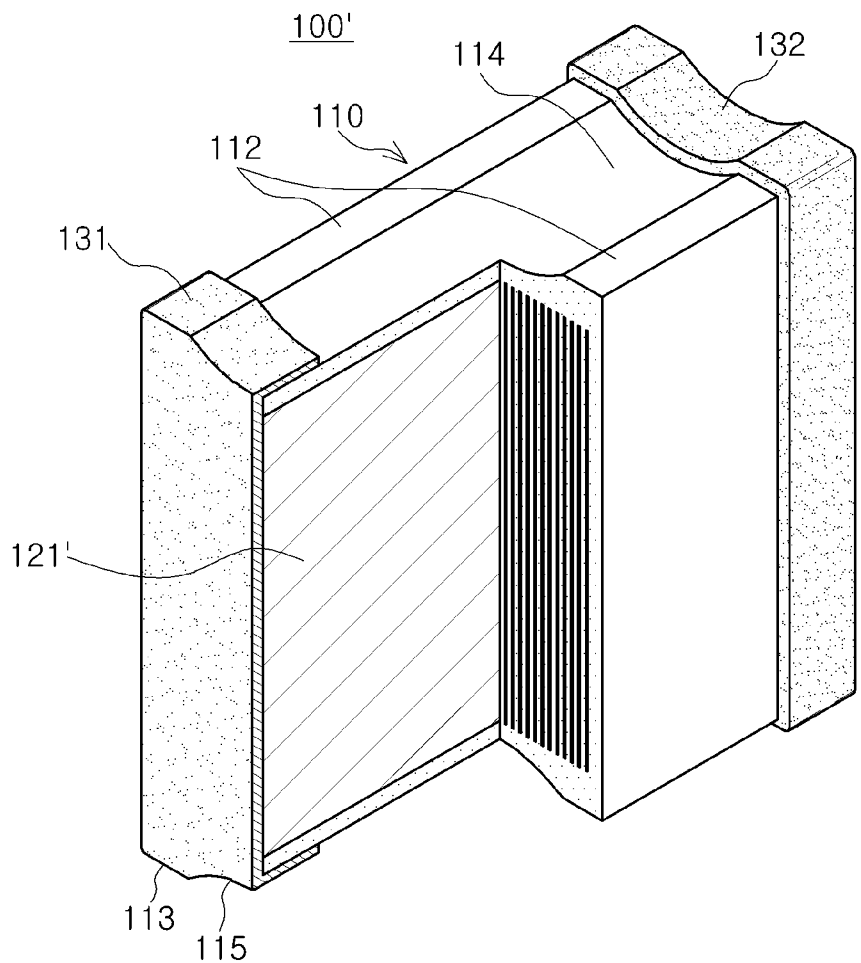
FIG. 3 is a partially cutaway perspective view of a multilayer ceramic capacitor according to another embodiment of the present invention.
Figure 3:
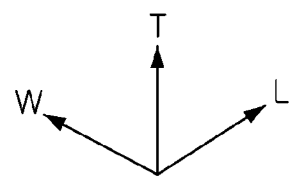
Figure 4:
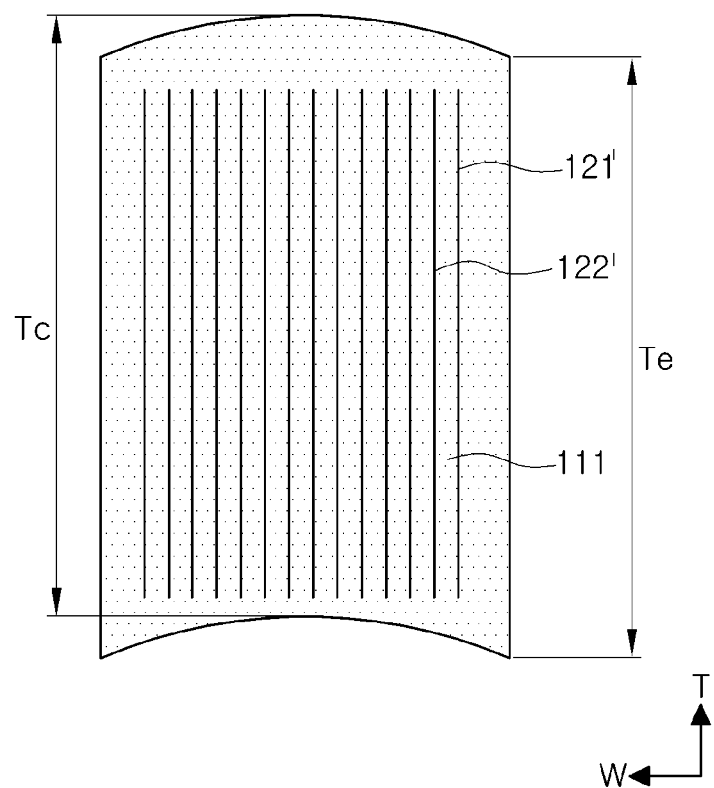
FIG. 4 is a cross-sectional view of the multilayer ceramic capacitor in a thickness-width direction according to another embodiment of the present invention.

FIG. 3 is a partially cutaway perspective view of a multilayer ceramic capacitor according to another embodiment of the present invention. FIG. 4 is a cross-sectional view of the multilayer ceramic capacitor in a thickness-width direction according to another embodiment of the present invention.

Here, since a structure in which the first and second external electrodes 131 and 132 are formed is the same as that of the previously described embodiment of the invention, a detailed description thereof will be omitted in order to avoid overlapped descriptions. First and second internal electrodes 121' and 122' having a different structure from the previously described embodiment of the invention will be described in detail.

Referring to FIGS. 3 and 4, a multilayer ceramic capacitor according to the present embodiment of the invention includes a multilayer ceramic body 110 including a plurality of the dielectric layers 111 stacked in a width direction.

Therefore, first and second internal electrodes 121' and 122' may be disposed in the width direction so as to face each other, having the ceramic sheet forming the dielectric layer interposed therebetween, and may be exposed through first and second end surfaces of the ceramic body 110, respectively. Here, the first and second internal electrodes 121' and 122' may be electrically insulated from each other by the dielectric layer 111 interposed therebetween.

Board for Mounting Multilayer Ceramic Capacitor

Figure 5:
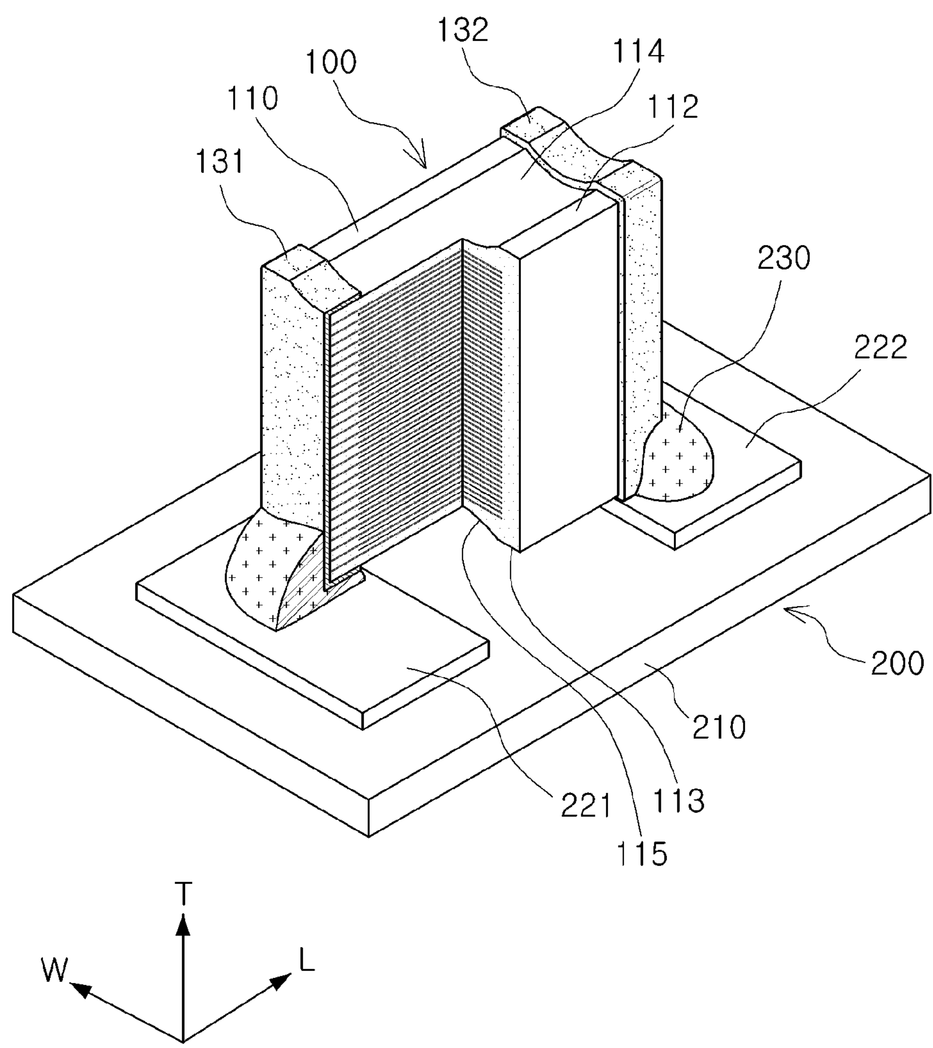
FIG. 5 is a partially cutaway perspective view of a multilayer ceramic capacitor mounted on a printed circuit board according to an embodiment of the present invention.

FIG. 5 is a partially cutaway perspective view of a multilayer ceramic capacitor mounted on a printed circuit board according to an embodiment of the present invention.

Referring to FIG. 5, a board 200 for mounting the multilayer ceramic capacitor 100 according to an embodiment of the present invention includes a printed circuit board 210 on which the multilayer ceramic capacitor 100 is mounted horizontally or vertically; and first and second electrode pads 221 and 222 formed on a surface of the printed circuit board 210 so as to be spaced apart from each other.

Here, the multilayer ceramic capacitor 100 may be electrically connected to the printed circuit board 210 by a solder 230 in a state in which the second main surface of the ceramic body 110 having the recess portion 115 may be disposed to be the lowermost portion in the thickness direction as a mounting surface, and portions of the first and second external electrodes 131 and 132 disposed on the second main surface may be positioned to contact the first and second electrode pads 221 and 222, respectively.

As set forth above, according to embodiments of the invention, a multilayer ceramic electronic component may have an effect of reducing mounting failures and short circuits by preventing the multilayer ceramic electronic component from toppling over at the time of being mounted on a printed circuit board or the like due to a recess portion formed in a length direction of a mounting surface thereof so as to be inwardly concave in a manner such that fine particle materials are used to increase a shrinkage rate in a lower region of a ceramic body in a thickness direction, while realizing a high level of capacitance as the number of stacked layers increases.

While the present invention has been shown and described in connection with the embodiments, it will be apparent to those skilled in the art that modifications and variations can be made without departing from the spirit and scope of the present invention as defined by the appended claims.

What is claimed is:

1. A multilayer ceramic electronic component, comprising:

a ceramic body including a plurality of dielectric layers and a recess portion formed in a length direction of at least one main surface thereof so as to be inwardly concave and satisfying $T/W>1.0$ when a width thereof is defined as W and a thickness thereof is defined as T;

a plurality of first and second internal electrodes disposed in the ceramic body so as to face each other, having the dielectric layer interposed therebetween, and alternately exposed through both end surfaces of the ceramic body; and first and second external electrodes extended from the end surfaces of the ceramic body to the at least one main surface in which the recess portion is formed, and electrically connected to the first and second internal electrodes, respectively, wherein when the ceramic body is divided into an upper region At, corresponding to 70% to 90% of an overall thickness of the ceramic body, and a lower region Ab, corresponding to 10% to 30% of the overall thickness of the ceramic body, a ratio of an average particle size of Ab materials to an average particle size of At materials is less than 0.5.

2. The multilayer ceramic electronic component of claim 1, wherein the first and second internal electrodes have a thickness of 0.2 μm to 0.85 μm.

3. The multilayer ceramic electronic component of claim 1, wherein the first and second internal electrodes disposed in the lower region of the ceramic body have a thickness greater than that of the first and second internal electrodes disposed in the upper region of the ceramic body.

4. The multilayer ceramic electronic component of claim 1, wherein the ceramic body satisfies $1.2<T/W<3.0$.

5. The multilayer ceramic electronic component of claim 1, wherein when a thickness of an edge portion of an end surface of the ceramic body is defined as Te and a thickness of a central portion of the end surface of the ceramic body is defined as Tc, $0.910 \leq Tc/Te<0.995$ is satisfied.

6. The multilayer ceramic electronic component of claim 1, wherein the upper region of the ceramic body has electrode connectivity of 80% or more.

7. The multilayer ceramic electronic component of claim 1, wherein the lower region of the ceramic body has electrode connectivity of 90% or more.

8. The multilayer ceramic electronic component of claim 1, wherein a difference in electrode connectivity between the lower region and the upper region of the ceramic body is 5% or more.

9. The multilayer ceramic electronic component of claim 1, wherein the ceramic body has the dielectric layers stacked in a thickness direction.

10. The multilayer ceramic electronic component of claim 1, wherein the ceramic body has the dielectric layers stacked in a width direction.

11. The multilayer ceramic electronic component of claim 1, wherein the recess portion is provided in both main surfaces of the ceramic body in an opposing manner.

12. A board for mounting a multilayer ceramic electronic component, the board comprising:

a printed circuit board having first and second electrode pads provided thereon; and the multilayer ceramic electronic component of claim 1 disposed on the first and second electrode pads.

* * * * *